(12) United States Patent
Schrama et al.

(10) Patent No.: US 12,295,181 B2
(45) Date of Patent: *May 6, 2025

(54) MONOLITHIC ELECTRICAL POWER CONVERTER FORMED WITH LAYERS

(71) Applicant: Lumileds LLC, San Jose, CA (US)

(72) Inventors: Charles André Schrama, San Jose, CA (US); Noman Rangwala, San Francisco, CA (US)

(73) Assignee: Lumileds LLC, San Jose, CA (US)

( * ) Notice: Subject to any disclaimer, the term of this patent is extended or adjusted under 35 U.S.C. 154(b) by 125 days.

This patent is subject to a terminal disclaimer.

(21) Appl. No.: 18/139,715

(22) Filed: Apr. 26, 2023

(65) Prior Publication Data

US 2023/0261132 A1    Aug. 17, 2023

Related U.S. Application Data

(63) Continuation of application No. 17/121,412, filed on Dec. 14, 2020, now Pat. No. 11,670,735.

(51) Int. Cl.
*H01L 31/12* (2006.01)
*H02M 7/00* (2006.01)
(Continued)

(52) U.S. Cl.
CPC .......... *H10F 55/255* (2025.01); *H02M 7/003* (2013.01); *H10F 77/60* (2025.01); *H10F 77/953* (2025.01)

(58) Field of Classification Search
CPC ....... H01L 31/12; H01L 31/125; H01L 31/14; H01L 31/143; H01L 31/145;
(Continued)

(56) References Cited

U.S. PATENT DOCUMENTS 8,895,838 B1   11/2014  Welser et al.
11,233,166 B2   1/2022  Suarez Arias
(Continued)

OTHER PUBLICATIONS

"U.S. Appl. No. 17/121,412, Notice of Allowance mailed Jan. 27, 2023", 9 pgs.
(Continued)

*Primary Examiner* — Hai L Nguyen
(74) *Attorney, Agent, or Firm* — Schwegman, Lundberg & Woessner, P.A.

(57) ABSTRACT

An electrical power converter can include a plurality of layers disposed on a substrate. An emitter, including a first semiconductor junction that is formed at an interface between a first pair of adjacent layers, can produce light in response to a first electrical signal. An absorber, including a second semiconductor junction that is formed at an interface between a second pair of adjacent layers, can absorb at least some of the light. Circuitry can produce a second electrical signal in response to the absorbed light. The second electrical signal can be substantially proportional to the first electrical signal and can be electrically isolated from the first electrical signal. Because the light can remain within the layers during use, the electrical power converter can have a higher efficiency than a comparable device that propagates the light through at least one interface between air and a semiconductor material.

20 Claims, 6 Drawing Sheets

(51) Int. Cl.
*H10F 55/255* (2025.01)
*H10F 77/00* (2025.01)
*H10F 77/60* (2025.01)

(58) Field of Classification Search
CPC ..... H01L 31/147; H01L 31/153; H01L 31/16; H01L 31/161; H01L 31/162; H01L 31/167; H01L 31/173; H01L 31/02; H01L 31/02002; H01L 31/02019; H01L 31/02024; H01L 31/024; H01L 31/00; H01L 27/00; H02M 7/00; H02M 7/03
USPC .................................. 327/100, 365
See application file for complete search history.

(56) References Cited

U.S. PATENT DOCUMENTS

| | | | |
|---|---|---|---|
| 11,670,735 B2 * | 6/2023 | Schrama | H01L 31/024 327/365 |
| 2022/0190187 A1 | 6/2022 | Schrama et al. | |

OTHER PUBLICATIONS

"U.S. Appl. No. 17/121,412, Response filed Jan. 10, 2023 to Restriction Requirement mailed Nov. 15, 2022", 9 pgs.
"U.S. Appl. No. 17/121,412, Restriction Requirement mailed Nov. 15, 2022", 5 pgs.

* cited by examiner

MONOLITHIC ELECTRICAL POWER CONVERTER FORMED WITH LAYERS

CLAIM OF PRIORITY

This application claims the benefit of U.S. patent application Ser. No. 17/121,412, filed on Dec. 14, 2020, now U.S. Pat. No. 11,670,735 B2, issued on Jun. 6, 2023, which is hereby incorporated by reference in its entirety.

TECHNICAL FIELD

The present disclosure relates to raising or lowering a voltage and lowering or raising a corresponding current of an electrical signal.

BACKGROUND

There is ongoing effort to improve raising or lowering a voltage and lowering or raising a corresponding current of an electrical signal.

Figure 1:
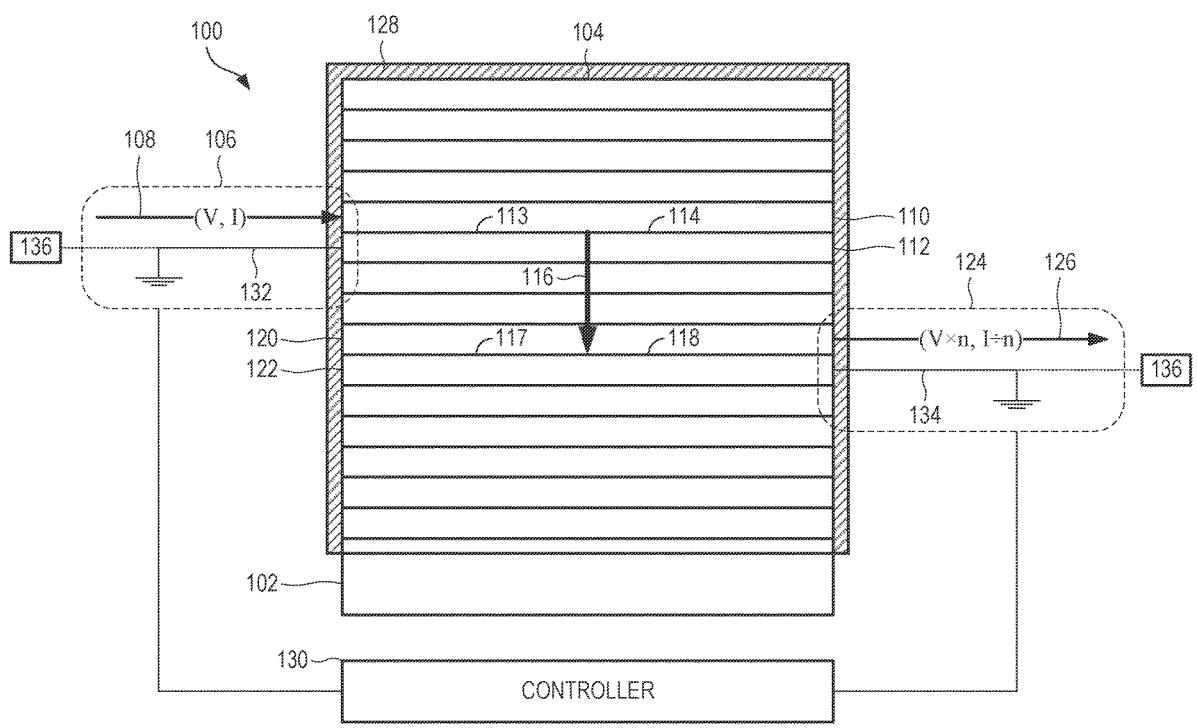
FIG. 1 shows a schematic drawing of an example of an electrical power converter, in accordance with some embodiments.

Corresponding reference characters indicate corresponding parts throughout the several views. Elements in the drawings are not necessarily drawn to scale. The configurations shown in the drawings are merely examples and should not be construed as limiting the scope of the disclosed subject matter in any manner.

DETAILED DESCRIPTION

Electrical circuitry can use an electrical power converter to raise or lower a voltage. For example, in a circuit in which a chip uses 2.5 volts for operation, but a power supply supplies 5 volts, the circuit can use an electrical power converter to decrease the voltage by a factor of two. Because electrical power is a product of voltage and current, the electrical power converter can vary the voltage and current simultaneously in a complementary manner. For example, the electrical power converter that decreases the voltage by a factor of two can also increase the current by a factor of two.

Historically, electrical power converters have converted an input direct current (DC) signal into an alternating current (AC), directed the AC signal through a first wire coil, used magnetic induction to induce an AC current in a second wire coil placed in proximity to the first wire coil, and rectified the AC current from the second wire coil to produce an output DC electrical signal. Over the years, as circuitry became denser, the electrical interference from these induction-based electrical power converters became problematic. In addition, ripple in the voltage and/or the current from the rectifying process may also be problematic.

Optical-based electrical power converters can overcome the drawbacks of induction-based electrical power converters. An optical-based electrical power converter can generate light in response to an input electrical signal, can absorb the light, and can generate an output electrical signal in response to the absorbed light. During operation, the light can be fully contained within the electrical power converter, such that the electrical power converter includes only electrical signals (e.g., voltages and/or currents) as its input and output signals.

In some examples, the light can be generated by a light-emitting diode that is powered by the input electrical signal. The light can be detected (e.g., sensed or absorbed) by a sensor or detector, which can function similar to a light-emitting diode operating in reverse. Such a sensor or detector can absorb the light and can produce the output electrical signal in response to the absorbed light. The output electrical signal can vary in voltage and current from the input electrical signal. For example, a voltage of the output electrical signal can equal a voltage of the input electrical signal multiplied by a specified factor, while a current of the output electrical signal can equal a current of the input electrical signal divided by the specified factor, such that power (e.g., a product of voltage and current) can be conserved. The specified factor can be determined by the configuration of elements within the electrical power converter, such as a selection of materials for generating (e.g., producing) and absorbing (e.g., sensing or detecting) the light, a geometry for an optical path within the electrical power converter, and so forth.

In some electrical power converters, light can be generated by one optical element and absorbed by another element. For example, light can be generated within a first semiconductor material, can pass through a first interface between the first semiconductor material and air, can propagate through air, can pass through a second interface between air and a second semiconductor material, and can be absorbed within the second semiconductor material. Semiconductor materials can have relatively high refractive indices, often having values typically between about 2 and about 4. In contrast, air has a relatively low refractive index, of approximately 1. Because power reflectivity at an interface can vary as a function of a difference in refractive index on opposite sides of the interface, the interface between a semiconductor material and air can have a relatively large power reflectivity. In practice, such a large power reflectivity can be a source of loss (e.g., a decrease in efficiency) for the electrical power converter. Although the interface can include one or more thin films that can help reduce the power reflectivity, the loss caused by passing through the interface can be typically reduced but not eliminated. As a result, passing the light through one or more interfaces between air and a semiconductor material can remain as a source of loss for the electrical power converter.

In the electrical power converters described in detail below, the light can be produced in a semiconductor material, and can remain within one or more semiconductor materials as it propagates along its optical path from its production to its detection. By remaining within one or more semiconductor materials from its production to its detection, the light avoids propagating though any interfaces between air and a semiconductor material, and therefore avoids any losses that would occur at these interfaces.

In an example, an electrical power converter can include a plurality of layers disposed on a substrate. An emitter, including a first semiconductor junction that is formed at an interface between a first pair of adjacent layers of the plurality of layers, can produce light in response to a first electrical signal. An absorber, including a second semiconductor junction that is formed at an interface between a second pair of adjacent layers of the plurality of layers, can absorb at least some of the light. Circuitry can produce a second electrical signal in response to the absorbed light. The second electrical signal can be substantially proportional to the first electrical signal and can be electrically isolated from the first electrical signal. Because the light can remain within the layers during use, the electrical power converter can have a higher efficiency than a comparable device that propagates the light through at least one interface between air and a semiconductor material.

FIG. 1 shows a schematic drawing of an example of an electrical power converter 100, in accordance with some embodiments.

The electrical power converter 100 can include a substrate 102. In some example, layers 104 can be grown or deposited on the substrate 102, such as by one or more semiconductor processes, such as exposing photoresist to form a pattern, etching the pattern, removing the remaining photoresist, and other photolithography techniques. In some examples, the substrate 102 can be provided in wafer form during the manufacturing process of the electrical power converter 100. Layers 104 can be deposited on the substrate 102 during the manufacturing process of the electrical power converter 100. The substrate 102 and layers 104, together, can be diced into individual devices during the manufacturing process of the electrical power converter 100. In some examples, the substrate 102 can be a carrier, with a die being disposed on a top of the carrier. Suitable substrate 102 materials can include sapphire, silicon carbide, one or more suitable ceramic materials, and others.

A plurality of layers 104 can be disposed on the substrate 102. In some examples, a layer 104 can include one or more semiconductor materials, such as a III-V semiconductor material, such as indium gallium nitride (InGaN, or $In_xGa_{1-x}N$) or indium gallium arsenide (InGaAs), and/or one or more alloys of different semiconductor materials. For the purposes of this document, materials having different concentrations of a same combination of group III or group V elements shall be considered to be different materials. Other materials can also be used. In some examples, the layers 104 can be substantially planar and can be substantially parallel to a plane of the substrate 102 and to one another.

First circuitry 106 can deliver a first electrical signal 108. The first circuitry 106 can include a pair of electrical leads or wires. During assembly of the electrical power converter 100, prior to use, the electrical leads or wires can be attached to particular layers 110, 112 of the plurality of layers 104. The first electrical signal 108 can be considered to be an input electrical signal, which can be produced by a power source or other circuitry and can be delivered to the layers 104 via the electrical leads or wires. The first electrical signal 108 can be direct current (DC), alternating current (AC), or irregular. FIG. 1 shows the first electrical signal 108 as having a voltage (V) and a current (I). The voltage (V) and current (I) can be time-independent or time-varying.

An emitter 113, including a first semiconductor junction 114, can produce light 116 in response to the first electrical signal 108. The first semiconductor junction 114 can be formed at an interface between a first pair 110, 112 of adjacent layers 104 of the plurality of layers 104. The first semiconductor junction 114 can include layers 110, 112 formed from two different semiconductor materials (e.g. semiconductor materials formed from different elements, different combinations of elements, and/or different ratios of composition of the elements), In some examples, the first semiconductor junction 114 can include a light-emitting diode (e.g. a structure that can produce light in response to an applied current). In some examples, the first semiconductor junction 114 can emit the light 116 at a first wavelength. The emission wavelength can be determined by the semiconductor materials used in the layers 110, 112 of the first semiconductor junction 114.

An absorber 117, including a second semiconductor junction 118 can absorb at least some of the light 116. The second semiconductor junction 118 can be formed at an interface between a second pair 120, 122 of adjacent layers 104 of the plurality of layers 104. The plurality of layers 104 can confine the light 116 within the plurality of layers 104 as the light 116 propagates from the first semiconductor junction 114 to the second semiconductor junction 118. In some examples, the second semiconductor junction 118 can include a photodiode (e.g., a structure that can produce an electrical current in response to incident light in an applied optical signal, such as the light 116). In some examples, the second semiconductor junction 118 can absorb the light 116 with a spectral absorption profile that peaks substantially at the first wavelength. In some examples, the layers 120, 122 that form the second semiconductor junction 118 can be formed from the same semiconductor materials that are in the respective layers 110, 112 that form the first semiconductor junction 114. In some examples, the layers 120, 122 that form the second semiconductor junction 118 can be formed from different semiconductor materials that the respective layers 110, 112 that form the first semiconductor junction 114.

Second circuitry 124 can produce a second electrical signal 126 in response to the absorbed light 116. The second circuitry 124 can include a pair of electrical leads or wires. During assembly of the electrical power converter 100, prior to use, the electrical leads or wires can be attached to particular layers 120, 122 of the plurality of layers 104. The second electrical signal 126 can be considered to be an output electrical signal, which can be delivered to one or more downstream electrical components in one or more circuits. The second electrical signal 126 can be direct current (DC), alternating current (AC), or irregular.

The second electrical signal 126 can be substantially proportional to the first electrical signal 108. Because electrical power is a conserved quantity in voltage/current conversion (neglecting losses), the electrical power converter 100 can vary the voltage and current simultaneously in a complementary manner. In the example of FIG. 1, the electrical power converter 100 can raise the voltage by a factor of n and can lower the current by the factor of n, where n is a real number that can have a value greater than one or less than one. FIG. 1 shows the second electrical signal 126 as having a voltage (V×n) and a current (I÷n). The voltage (V×n) and current (I÷n) can be time-independent or time-varying.

The second electrical signal 126 can be electrically isolated from the first electrical signal 108. The electrical power converter 100 receives an electrical signal, converts the electrical signal to an optical signal, and converts the optical signal back to an electrical signal. Because the optical signal propagates the power between the first semiconductor junction 114 and the second semiconductor junction 118, electrical current does not flow between the first semiconductor junction 114 and the second semiconductor junction 118. As a result, the second semiconductor junction 118 is electrically isolated from the first semiconductor junction 114. Such isolation can help protect equipment against spikes in voltage or current and can help reduce noise due to grounding-induced currents.

In some examples, the plurality of layers 104 can be disposed on a top of the substrate 102. An optional metallic coating 128 can be disposed on at least one of a top of the plurality of layers 104 or a side of the plurality of layers 104. The metallic coating 128 can be substantially opaque to the light 116. The metallic coating 128 can be formed from gold, silver, aluminum, or another opaque and/or reflective metal. As a result, the metallic coating 128 can help contain the light 116 within the layers 104 (e.g., by reflecting and/or absorbing any of the light 116 that strikes the metallic coating 128). In some examples, in which the metallic coating 128 can reflect the light 116 back into the plurality of layers 104, the metallic coating 128 can direct at least some of the reflected light 116 into the second semiconductor junction 118. This can provide an additional opportunity to be absorbed by the second semiconductor junction 118 and can improve an efficiency of the electrical power converter 100.

In some examples, the electrical power converter 100 can optionally be bi-directional. For example, in addition to the configuration shown in FIG. 1, in which the first circuitry 106 delivers the first electrical signal 108 (e.g., the input electrical signal) and the second circuitry 124 produces the second electrical signal 126 (e.g., the output electrical signal), the electrical power converter 100 can have a second configuration, in which the second circuitry 124 delivers the input electrical signal and the first circuitry 106 produces the output electrical signal.

For second configuration of the bi-directional operation, the second circuitry 124 can deliver a third electrical signal, the second semiconductor junction 118 can produce second light in response to the third electrical signal, the first semiconductor junction 114 can absorb at least some of the second light, and the first circuitry 106 can produce a fourth electrical signal in response to the absorbed second light. The fourth electrical signal can be substantially proportional to the third electrical signal and can be electrically isolated from the third electrical signal.

For examples in which the electrical power converter 100 is bi-directional, the electrical power converter 100 can include a controller 130 coupled to the first circuitry 106 and the second circuitry 124. The controller 130 can switch between the first configuration (shown in FIG. 1), in which the second electrical signal 126 is produced in response to the first electrical signal 108, and the second configuration, in which the fourth electrical signal is produced in response to the third electrical signal. Such switching can affect the electrical connections associated with the first circuitry 106 and the second circuitry 124, but may not directly affect the semiconductor junctions 114, 118 or the plurality of layers 104.

In some examples, a heat sink 136, which can be thermally coupled to one or both of electrical leads 132 and 134, can be thermally coupled to the substrate 102 and can direct heat away from the first semiconductor junction 114 and the second semiconductor junction 118. The heat sink 136 can include a material having a generally high thermal conductivity, such as a metal, to direct the heat away from the semiconductor junctions. In some examples, the heat sink 136 can be integrated into or thermally coupled to the first circuitry 106 and/or the second circuitry 124. For example, one electrical lead 132 for the first circuitry 106 and/or one electrical lead 134 for the second circuitry 124 can be connected to ground, and can also thermally connect to the heat sink 136.

There are several configurations possible for the layers 104, which are shown by example in FIGS. 2-5. Other elements of FIG. 1, including the metallic coating 128, the controller 130, the heat sink 136, and others, may also be used with the configurations of FIGS. 2-5.

Figure 2:
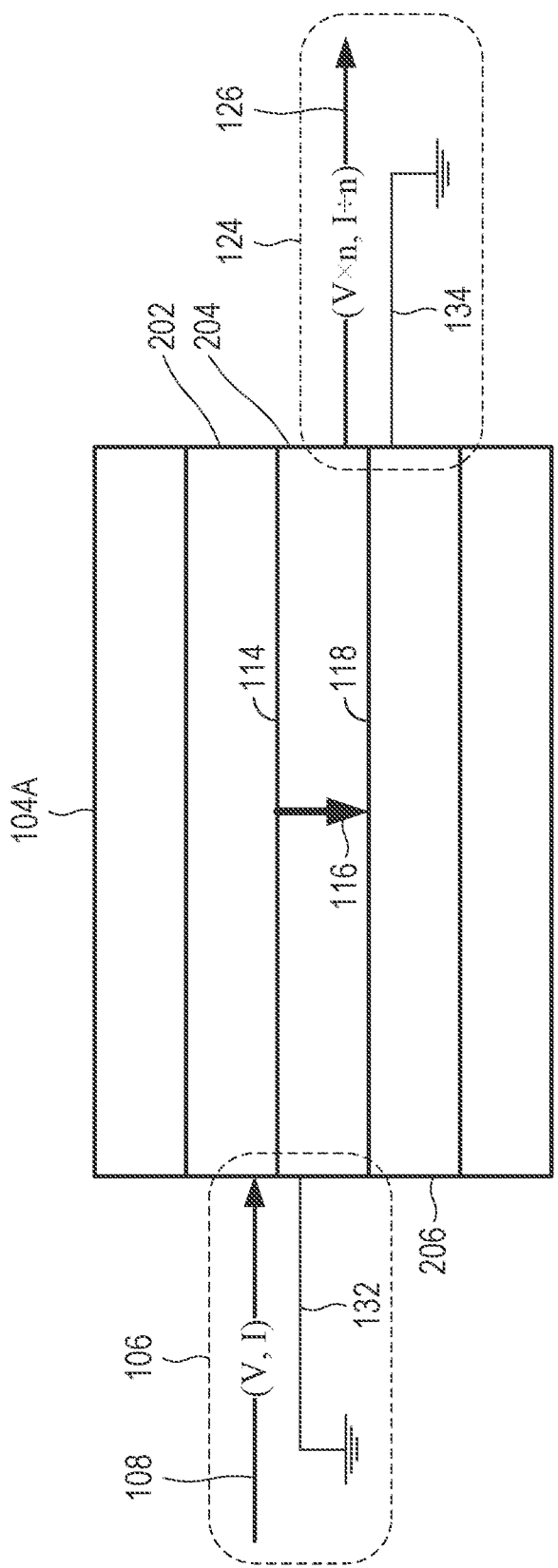
FIG. 2 shows a schematic drawing of an example of a first configuration for at least some of the layers of the electrical power converter of FIG. 1, in accordance with some embodiments.

FIG. 2 shows a schematic drawing of an example of a first configuration for at least some of the layers 104A of the electrical power converter 100 of FIG. 1, in accordance with some embodiments.

In the configuration of FIG. 2, the first pair of adjacent layers 104A includes a first layer 202 and a second layer 204, and the second pair of adjacent layers 104A includes the second layer 204 and a third layer 206 that is different from the first layer 202. The first layer 202 and the second layer 204 form the first semiconductor junction 114. The second layer 204 and the third layer 206 form the second semiconductor junction 118.

In some examples, the first pair of adjacent layers 104A can include layers formed from a first semiconductor material and a second semiconductor material, respectively, the second semiconductor material differing from the first semiconductor material. The second pair of adjacent layers 104A can include layers formed from the second semiconductor material and a third semiconductor material, respectively, the third semiconductor material differing from the first semiconductor material and the second semiconductor material.

In some examples, the first pair of adjacent layers 104A can include layers formed from a first semiconductor material and a second semiconductor material, respectively, the second semiconductor material differing from the first semiconductor material. The second pair of adjacent layers 104A can include layers formed from the second semiconductor material and the first semiconductor material, respectively.

Figure 3:
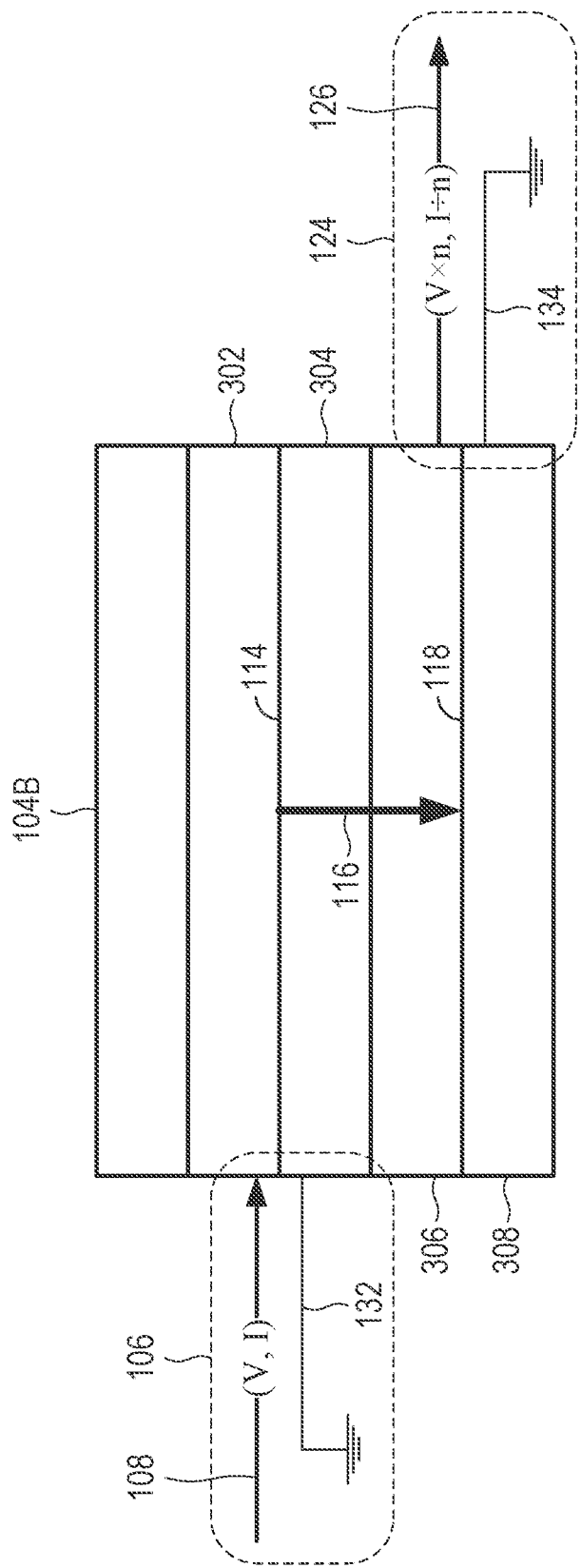
FIG. 3 shows a schematic drawing of an example of a second configuration for at least some of the layers of the electrical power converter of FIG. 1, in accordance with some embodiments.

FIG. 3 shows a schematic drawing of an example of a second configuration for at least some of the layers 104B of the electrical power converter 100 of FIG. 1, in accordance with some embodiments.

In the configuration of FIG. 3, the first pair of adjacent layers 104B includes a first layer 302 and a second layer 304, and the second pair of adjacent layers 104B includes a third layer 306 and a fourth layer 308 that are different from the first layer 302 and the second layer 304. The first layer 302 and the second layer 304 form the first semiconductor junction 114. The third layer 306 and the fourth layer 306 form the second semiconductor junction 118.

In some examples, the first pair of adjacent layers 104B can include layers formed from a first semiconductor material and a second semiconductor material, respectively, the second semiconductor material differing from the first semiconductor material. The second pair of adjacent layers 104B can include layers formed from the second semiconductor material and a third semiconductor material, respectively, the third semiconductor material differing from the first semiconductor material and the second semiconductor material.

In some examples, the first pair of adjacent layers 104B can include layers formed from a first semiconductor material and a second semiconductor material, respectively, the second semiconductor material differing from the first semiconductor material. The second pair of adjacent layers 104B can include layers formed from the second semiconductor material and the first semiconductor material, respectively.

In the configurations of FIGS. 1-3, the layers 104, 104A, 104B can extend over a full lateral extent of the substrate 102, and light 116 can propagate orthogonal or generally orthogonal to a plane of the substrate 102 or the respective planes of the layers 104, 104A, 104B. There are alternate configurations where one or more layers can extend over only a portion of the substrate, so that one or more layers can be located laterally adjacent to one another. In these alternate configurations, shown in FIGS. 4-5, light 116 can propagate generally parallel to the plane of the substrate 102 or the respective planes of the layers.

Figure 4:
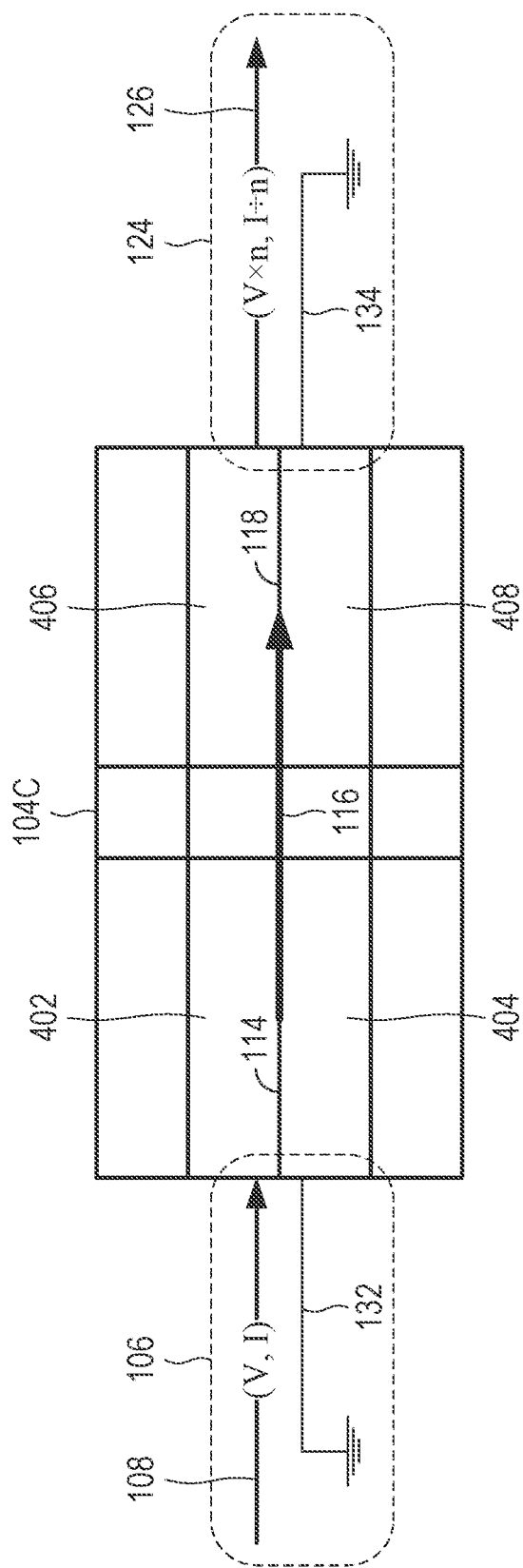
FIG. 4 shows a schematic drawing of an example of a third configuration for at least some of the layers of the electrical power converter of FIG. 1, in accordance with some embodiments.

FIG. 4 shows a schematic drawing of an example of a third configuration for at least some of the layers 104C of the electrical power converter 100 of FIG. 1, in accordance with some embodiments.

In the configuration of FIG. 4, the first pair of adjacent layers 104C includes a first layer 402 and a second layer 404, and the second pair of adjacent layers 104C includes a third layer 406 and a fourth layer 408 that are different from the first layer 402 and the second layer 404. The first layer 402 and the second layer 404 form the first semiconductor junction 114. The third layer 406 and the fourth layer 406 form the second semiconductor junction 118.

In the configuration of FIG. 4, the first semiconductor junction 114 and the second semiconductor junction 118 can be generally coplanar, and can be laterally adjacent to each other. The first semiconductor junction 114 and the second semiconductor junction 118 can be spaced apart by an intermediate region formed from a semiconductor material, or from another suitable material having a relatively high refractive index. By spacing the first semiconductor junction 114 and the second semiconductor junction 118 apart in this manner, with a high-refractive index between them, the light 116 may not pass through a semiconductor/air interface, which can reduce or eliminate losses associated with passing through such an interface.

In some examples, the first pair of adjacent layers 104C can include layers formed from a first semiconductor material and a second semiconductor material, respectively, the second semiconductor material differing from the first semiconductor material. The second pair of adjacent layers 104C can include layers formed from the second semiconductor material and a third semiconductor material, respectively, the third semiconductor material differing from the first semiconductor material and the second semiconductor material.

In some examples, the first pair of adjacent layers 104C can include layers formed from a first semiconductor material and a second semiconductor material, respectively, the second semiconductor material differing from the first semiconductor material. The second pair of adjacent layers 104C can include layers formed from the second semiconductor material and the first semiconductor material, respectively.

Figure 5:
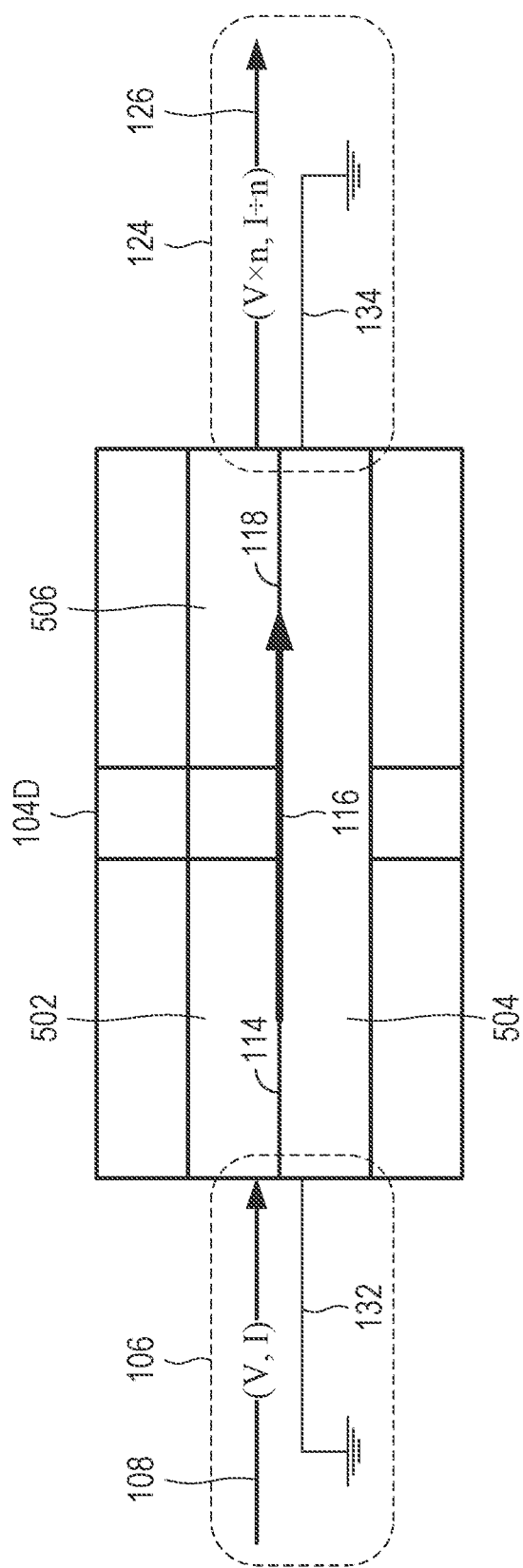
FIG. 5 shows a schematic drawing of an example of a fourth configuration for at least some of the layers of the electrical power converter of FIG. 1, in accordance with some embodiments.

FIG. 5 shows a schematic drawing of an example of a fourth configuration for at least some of the layers 104D of the electrical power converter 100 of FIG. 1, in accordance with some embodiments.

In the configuration of FIG. 5, the first pair of adjacent layers 104D includes a first layer 502 and a second layer 504, and the second pair of adjacent layers 104D includes the second layer 504 and a third layer 506 that is different from the first layer 502. The first layer 502 and the second layer 504 form the first semiconductor junction 114. The second layer 504 and the third layer 506 form the second semiconductor junction 118.

In some examples, the first pair of adjacent layers 104D can include layers formed from a first semiconductor material and a second semiconductor material, respectively, the second semiconductor material differing from the first semiconductor material. The second pair of adjacent layers 104D can include layers formed from the second semiconductor material and a third semiconductor material, respectively, the third semiconductor material differing from the first semiconductor material and the second semiconductor material.

In some examples, the first pair of adjacent layers 104D can include layers formed from a first semiconductor material and a second semiconductor material, respectively, the second semiconductor material differing from the first semiconductor material. The second pair of adjacent layers 104D can include layers formed from the second semiconductor material and the first semiconductor material, respectively.

The examples presented thus far include a single emitter, formed at one semiconductor junction, and a single absorber, formed at another semiconductor junction. Other configurations are possible, which can include multiple emitters and/or multiple absorbers. For example, in the configurations of FIG. 1, 2, or 3, one or both of the layers that form the first semiconductor junction 114 may be split into two or more layer portions, optionally with each layer portion being formed from a different semiconductor material. The layer portions can be electrically connected in series, with light propagating in parallel from the layer portions across the first semiconductor junction 114. Similarly, the second semiconductor junction 118 may be split into two or more layer portions, optionally with each layer portion being formed from a different semiconductor material. Splitting layers into layer portions in this manner can optionally increase flexibility in tailoring an electrical response as a function of wavelength.

Figure 6:
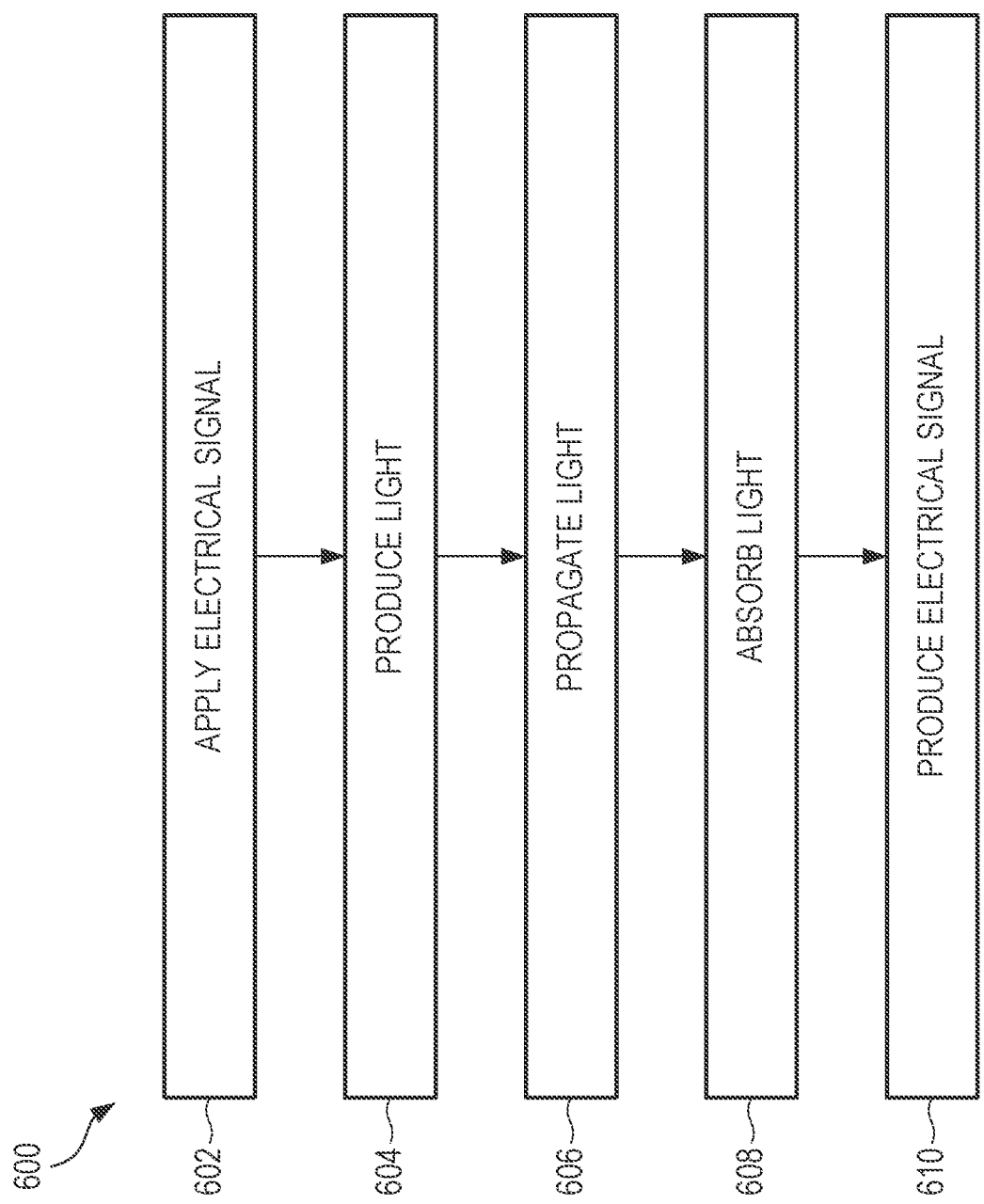
FIG. 6 shows an example of a method for scaling an electrical signal, in accordance with some embodiments.

FIG. 6 shows an example of a method 600 for scaling an electrical signal, in accordance with some embodiments. For example, scaling an electrical signal can include multiplying a voltage of the electrical signal by a specified factor and dividing a current of the electrical signal by the specified factor. The specified factor can be greater than one or less than one.

At operation 602, the method 600 includes applying a first electrical signal to a first semiconductor junction, the first semiconductor junction being formed at an interface between a first pair of adjacent layers of a plurality of layers disposed on a substrate.

At operation 604, the method 600 includes producing light with the first semiconductor junction in response to the first electrical signal.

At operation 606, the method 600 includes propagating the light from the first semiconductor junction to a second semiconductor junction, the second semiconductor junction being formed at an interface between a second pair of adjacent layers of the plurality of layers.

At operation 608, the method 600 includes absorbing at least some of the light with the second semiconductor junction.

At operation 610, the method 600 includes producing, in response to the absorbed light, a second electrical signal with second circuitry coupled to the second semiconductor junction, the second electrical signal being substantially proportional to the first electrical signal and being electrically isolated from the first electrical signal.

The method 600 can optionally further include confining the light within the plurality of layers as the light propagates from the first semiconductor junction to the second semiconductor junction.

In some examples, in which the method 600 employs bi-directionality, the second circuitry can further deliver a third electrical signal, the second semiconductor junction can further produce second light in response to the third electrical signal, the first semiconductor junction can further absorb at least some of the second light, and the first circuitry can further produce a fourth electrical signal in response to the absorbed second light, the fourth electrical signal being substantially proportional to the third electrical signal and being electrically isolated from the third electrical signal.

The method 600 can optionally further include switching, with a controller coupled to the first circuitry and the second circuitry, between a first configuration, in which the second electrical signal is produced in response to the first electrical signal, and a second configuration, in which the fourth electrical signal is produced in response to the third electrical signal.

While exemplary embodiments of the present disclosed subject matter have been shown and described herein, it will be obvious to those skilled in the art that such embodiments are provided by way of example only. Numerous variations, changes, and substitutions will now occur to those skilled in the art, upon reading and understanding the material provided herein, without departing from the disclosed subject matter. Various alternatives to the embodiments of the disclosed subject matter described herein may be employed in practicing the various embodiments of the subject matter. It is intended that the following claims define the scope of the disclosed subject matter and that methods and structures within the scope of these claims and their equivalents be covered thereby.

What is claimed is:

1. An electrical power converter, comprising:
   first circuitry configured to deliver a first electrical signal;
   an emitter configured to produce light in response to the first electrical signal;
   an absorber configured to absorb at least some of the light;
   a metallic coating that at least partially surrounds the emitter and the absorber and is substantially opaque to the light; and
   second circuitry configured to produce a second electrical signal in response to the absorbed light, the second electrical signal being substantially proportional to the first electrical signal and being electrically isolated from the first electrical signal.

2. The electrical power converter of claim 1, wherein the light, during propagation from the emitter to the absorber, does not pass through an interface between air and a solid material.

3. The electrical power converter of claim 1, wherein the light is contained at least partially within the metallic coating.

4. The electrical power converter of claim 1, wherein the emitter and the absorber are formed at interfaces between adjacent layers of a plurality of layers.

5. The electrical power converter of claim 1, wherein:
   the emitter comprises a first semiconductor junction that is formed at an interface between a first pair of adjacent layers of a plurality of layers; and
   the absorber comprises a second semiconductor junction that is formed at an interface between a second pair of adjacent layers of the plurality of layers.

6. The electrical power converter of claim 5, wherein the plurality of layers is configured to confine the light within the plurality of layers as the light propagates from the first semiconductor junction to the second semiconductor junction.

7. The electrical power converter of claim 5, wherein:
   the plurality of layers is disposed on a top of a substrate.

8. The electrical power converter of claim 7, further comprising a heat sink thermally coupled to the substrate and configured to direct heat away from the first semiconductor junction and the second semiconductor junction.

9. The electrical power converter of claim 5, wherein the first semiconductor junction comprises a light-emitting diode and the second semiconductor junction comprises a photodiode.

10. The electrical power converter of claim 5, wherein:
    the first semiconductor junction is configured to emit light at a first wavelength; and
    the second semiconductor junction is configured to absorb light with a spectral absorption profile that peaks substantially at the first wavelength.

11. The electrical power converter of claim 5, wherein:
    the first pair of adjacent layers includes a first layer and a second layer; and
    the second pair of adjacent layers includes the second layer and a third layer that is different from the first layer.

12. The electrical power converter of claim 5, wherein:
    the first pair of adjacent layers includes a first layer and a second layer; and
    the second pair of adjacent layers includes a third layer and a fourth layer that are different from the first layer and the second layer.

13. The electrical power converter of claim 5, wherein:
    the first pair of adjacent layers includes layers formed from a first semiconductor material and a second semiconductor material, respectively, the second semiconductor material differing from the first semiconductor material; and
    the second pair of adjacent layers includes layers formed from the second semiconductor material and a third semiconductor material, respectively, the third semiconductor material differing from the first semiconductor material and the second semiconductor material.

14. The electrical power converter of claim 5, wherein:
    the first pair of adjacent layers includes layers formed from a first semiconductor material and a second semiconductor material, respectively, the second semiconductor material differing from the first semiconductor material; and
    the second pair of adjacent layers includes layers formed from the first semiconductor material and the second semiconductor material, respectively.

15. The electrical power converter of claim 5, further comprising a controller coupled to the first circuitry and the second circuitry wherein:
    the second circuitry is further configured to deliver a third electrical signal;
    the second semiconductor junction is further configured to produce second light in response to the third electrical signal;
    the first semiconductor junction is further configured to absorb at least some of the second light;
    the first circuitry is further configured to produce a fourth electrical signal in response to the absorbed second light, the fourth electrical signal being substantially proportional to the third electrical signal and being electrically isolated from the third electrical signal; and the controller is configured to switch between a first configuration, in which the second electrical signal is produced in response to the first electrical signal, and a second configuration, in which the fourth electrical signal is produced in response to the third electrical signal.

16. A method for scaling an electrical signal, the method comprising:

applying a first electrical signal to an emitter;

producing light with the emitter in response to the first electrical signal;

propagating the light from the emitter to an absorber;

reflecting or absorbing at least some of the light with a metallic coating that at least partially surrounds the emitter and the absorber;

absorbing at least some of the light with the absorber; and producing, in response to the absorbed light, a second electrical signal with second circuitry coupled to the absorber, the second electrical signal being substantially proportional to the first electrical signal and being electrically isolated from the first electrical signal.

17. The method of claim 16, wherein the light, during propagation from the emitter to the absorber, does not pass through an interface between air and a solid material.

18. The method of claim 16, wherein the light is contained at least partially within the metallic coating.

19. The method of claim 16, wherein:

the emitter comprises a first semiconductor junction that is formed at an interface between a first pair of adjacent layers of a plurality of layers; and the absorber comprises a second semiconductor junction that is formed at an interface between a second pair of adjacent layers of the plurality of layers.

20. An electrical power converter, comprising:

first circuitry configured to deliver a first electrical signal;

an emitter configured to produce light in response to the first electrical signal;

an absorber configured to absorb at least some of the light, the light propagating from the emitter to the absorber without passing through an interface between air and a solid material, the emitter and the absorber being formed at interfaces between adjacent layers of a plurality of layers;

a metallic coating that at least partially surrounds the emitter and the absorber and is substantially opaque to the light; and second circuitry configured to produce a second electrical signal in response to the absorbed light, the second electrical signal being substantially proportional to the first electrical signal and being electrically isolated from the first electrical signal.

* * * * *